US008736359B2

(12) United States Patent
Sugiyama

(10) Patent No.: US 8,736,359 B2
(45) Date of Patent: May 27, 2014

(54) SIGNAL PROCESSING METHOD, INFORMATION PROCESSING APPARATUS, AND STORAGE MEDIUM FOR STORING A SIGNAL PROCESSING PROGRAM

(75) Inventor: Akihiko Sugiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/505,998

(22) PCT Filed: Nov. 2, 2010

(86) PCT No.: PCT/JP2010/069875
§ 371 (c)(1), (2), (4) Date: May 3, 2012

(87) PCT Pub. No.: WO2011/055834
PCT Pub. Date: May 12, 2011

(65) Prior Publication Data

US 2012/0268198 A1 Oct. 25, 2012

(30) Foreign Application Priority Data

Nov. 6, 2009 (JP) ................................. 2009-255420

(51) Int. Cl.
*H03K 5/00* (2006.01)

(52) U.S. Cl.
USPC .......................................... 327/551; 327/552

(58) Field of Classification Search
USPC ................................................. 327/551–559
See application file for complete search history.

(56) References Cited

U.S. PATENT DOCUMENTS

| | | | | |
|---|---|---|---|---|
| 4,628,529 | A | 12/1986 | Borth et al. | |
| 4,658,426 | A | 4/1987 | Chabries et al. | |
| 6,108,610 | A | 8/2000 | Winn | |
| 6,778,954 | B1 | 8/2004 | Kim et al. | |
| 7,408,891 | B2 * | 8/2008 | Popovic et al. | 370/290 |
| 8,345,807 | B2 * | 1/2013 | Nadamoto et al. | 375/347 |
| 2007/0237271 | A1 | 10/2007 | Pessoa et al. | |

FOREIGN PATENT DOCUMENTS

| | | | |
|---|---|---|---|
| JP | 5-48390 | A | 2/1993 |
| JP | 8-221092 | A | 8/1996 |
| JP | 2001-215990 | A | 8/2001 |
| JP | 2003-216180 | A | 7/2003 |
| JP | 200545314 | A | 2/2005 |
| JP | 2006-279185 | A | 10/2006 |
| JP | 2006-287387 | A | 10/2006 |
| JP | 4282227 | B2 | 6/2009 |
| WO | 2007/058121 | A1 | 5/2007 |

OTHER PUBLICATIONS

Akihiko Sugiyama, "A Robust NLMS Algorithm With a Novel Noise Modeling Based on Stationary/Nonstationary Noise Decomposition," IEEE International Conference on Acoustics, Speech and Signal Processing, May 2009, pp. 201-204.

(Continued)

*Primary Examiner* — Dinh T. Le
(74) *Attorney, Agent, or Firm* — Sughrue Mion, PLLC

(57) ABSTRACT

This invention provides a signal processing technique of suppressing various kinds of noise including unknown noise without storing a number of pieces of noise information in advance. To accomplish this, noise information is modified using modification information to obtain modified noise information. The noise in the noisy signal is suppressed using the modified noise information. The modification information is adapted and updated for the result of the step of suppressing.

11 Claims, 12 Drawing Sheets

(56) References Cited

OTHER PUBLICATIONS

Search Report issued by the European Patent Office dated Apr. 29, 2013 in correspondence to Application No. 10828392.0.

Office Action dated Nov. 5, 2013, issued by the Japan Patent Office in corresponding Japanese Application No. 2009-255420.

* cited by examiner

SIGNAL PROCESSING METHOD, INFORMATION PROCESSING APPARATUS, AND STORAGE MEDIUM FOR STORING A SIGNAL PROCESSING PROGRAM

CROSS REFERENCE TO RELATED APPLICATION

This application is a National Stage of International Application No. PCT/JP2010/069875 filed Nov. 2, 2010, claiming priority based on Japanese Patent Application No. 2009-255420 filed Nov. 6, 2009, the contents of all of which are incorporated herein by reference in their entirety.

This application is based upon and claims the benefit of priority from Japanese patent application No. 2009-255420, filed on Nov. 6, 2009, the disclosure of which is incorporated herein in its entirety by reference.

TECHNICAL FIELD

The present invention relates to a signal processing technique of suppressing noise in a noisy signal to enhance a target signal.

BACKGROUND ART

A noise suppressing technology is known as a signal processing technology of partially or completely suppressing noise in a noisy signal (a signal containing a mixture of noise and a target signal) and outputting an enhanced signal (a signal obtained by enhancing the target signal). For example, a noise suppressor is a system that suppresses noise mixed in a target audio signal. The noise suppressor is used in various audio terminals such as mobile phones.

Concerning technologies of this type, patent literature 1 discloses a method of suppressing noise by multiplying an input signal by a spectral gain smaller than 1. Patent literature 2 discloses a method of suppressing noise by directly subtracting estimated noise from a noisy signal.

The techniques described in patent literatures 1 and 2 need to estimate noise from the target signal that has already become noisy due to the mixed noise. However, there are limitations on accurately estimating noise only from the noisy signal. Hence, the methods described in patent literatures 1 and 2 are effective only when the noise is much smaller than the target signal. If the condition that the noise is much smaller than the target signal is not satisfied, the noise estimate accuracy is poor. For this reason, the methods described in patent literatures 1 and 2 can achieve no sufficient noise suppression effect, and the enhanced signal includes a larger distortion.

On the other hand, patent literature 3 discloses a noise suppressing system capable of implementing a sufficient noise suppression effect and a smaller distortion in the enhanced signal even if the condition that the noise is much smaller than the target signal is not satisfied. Assuming that the characteristics of noise to be mixed into the target signal are known in advance to a certain extent, the method described in patent literature 3 subtracts previously recorded noise information (information about the noise characteristics) from the noisy signal, thereby suppressing the noise. Patent literature 3 also discloses a method of, if an input signal power obtained by analyzing an input signal is large, integrating a large coefficient into noise information, or if the input signal power is small, integrating a small coefficient, and subtracting the integration result from the noisy signal.

CITATION LIST

Patent Literature

[PTL 1] Japanese Patent No. 4282227
[PTL 2] Japanese Patent Laid-Open No. 8-221092
[PTL 3] Japanese Patent Laid-Open No. 2006-279185

SUMMARY OF INVENTION

However, the arrangement disclosed in patent literature 3 described above needs to store noise characteristic information in advance, and the types of erasable noise are extremely limited. To increase the types of erasable noise, a number of pieces of noise information need to be recorded. This increases the necessary memory size and the manufacturing cost of the apparatus. In addition, the technique disclosed in patent literature 3 cannot suppress unknown noise different from the stored noise information.

The present invention has been made in consideration of the above-described situation, and has as its exemplary object to provide a signal processing technique of solving the above-described problems.

In order to achieve the above exemplary object, a method according to an exemplary aspect of the present invention includes, when suppressing noise in a noisy signal, modifying noise information about the noise in the noisy signal using modification information to obtain modified noise information, suppressing the noise in the noisy signal using the modified noise information, and adapting the modification information based on a noise suppression result.

In order to achieve the above exemplary object, an apparatus according to another exemplary aspect of the present invention includes a noise suppressor that suppresses noise in a noisy signal, and a modification unit that modifies noise information using modification information adapted based on a result of suppression of the noise in the noisy signal so as to obtain modified noise information, wherein the noise suppressor suppresses the noise in the noisy signal using the modified noise information.

In order to achieve the above exemplary object, a program stored in a program recording medium according to still another exemplary aspect of the present invention causes a computer to execute a noise suppressing process of suppressing noise in a noisy signal, and modification processing of modifying noise information based on a result of suppression of the noise in the noisy signal so as to obtain modified noise information to be used in the noise suppressing process.

Advantageous Effect of Invention

According to the present invention, it is possible to provide a signal processing technique of suppressing various kinds of noise including unknown noise without storing a number of pieces of noise information in advance.

EXEMPLARY EMBODIMENTS

Exemplary embodiments will now be described in detail by way of example with reference to the accompanying drawings. Note that the constituent elements described in the exemplary embodiments are merely examples, and the technical scope is not limited by the following exemplary embodiments.

(First Exemplary Embodiment)

<Overall Arrangement>

Figure 1:
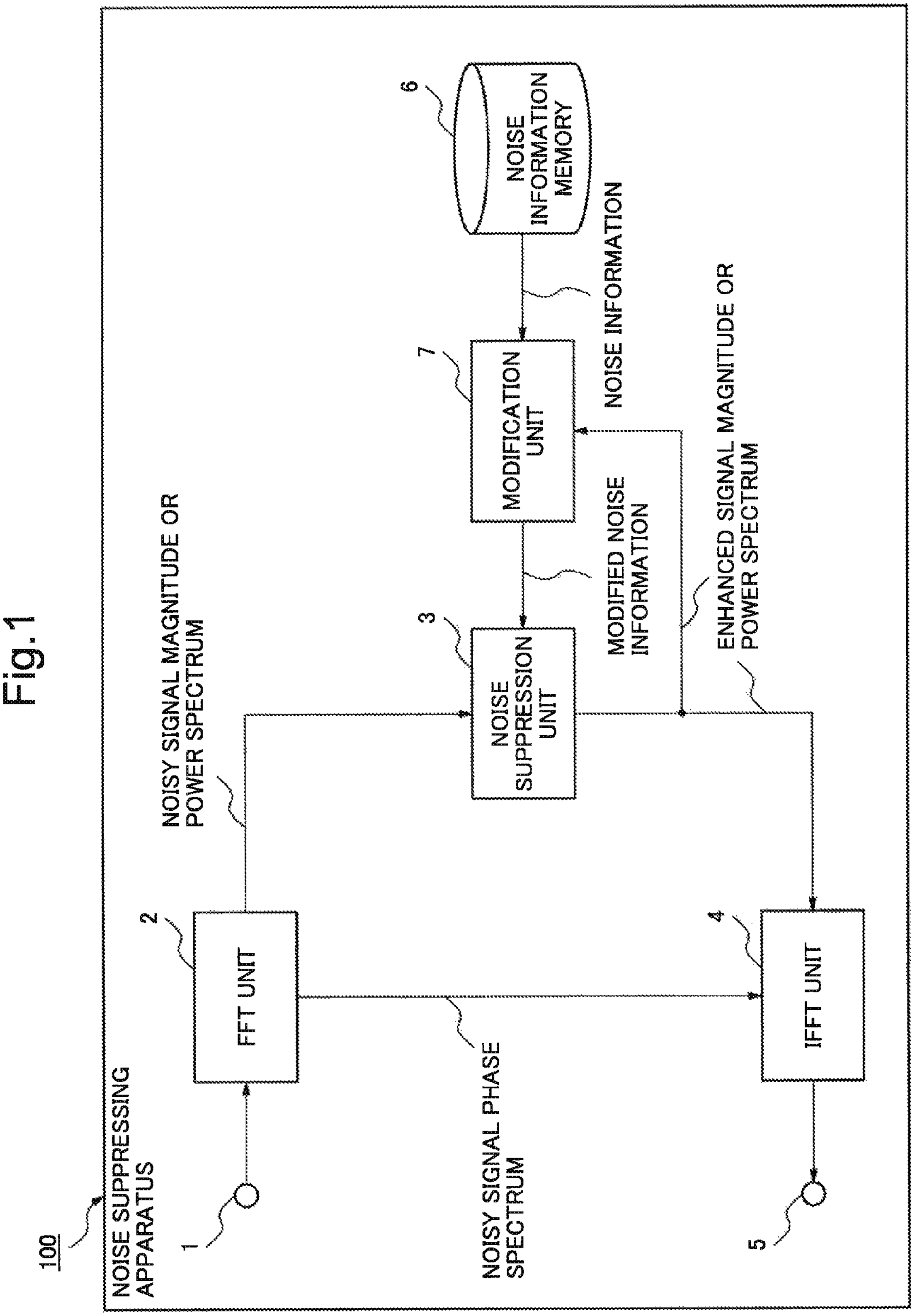
FIG. 1 is a block diagram showing the schematic arrangement of a noise suppressing apparatus 100 according to the first exemplary embodiment of the present invention.
Figure 12:
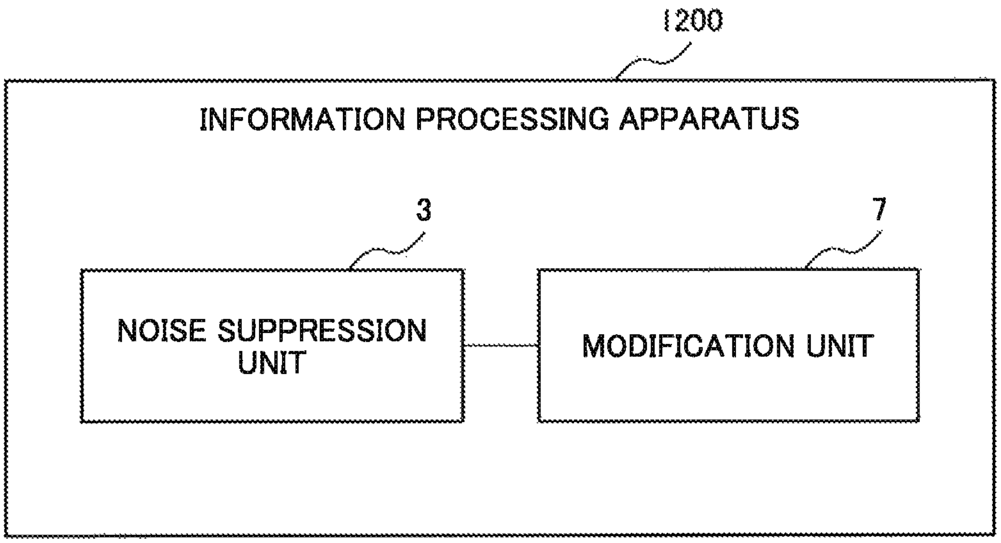
FIG. 12 is a block diagram showing an example of the arrangement of an information processing apparatus 1200 according to the present invention.

As the first exemplary embodiment for implementing a signal processing method, a noise suppressing apparatus will be explained, which partially or completely suppresses noise in a noisy signal (a signal containing a mixture of noise and a target signal) and outputs an enhanced signal (a signal obtained by enhancing the target signal). FIG. 1 is a block diagram showing the overall arrangement of a noise suppressing apparatus 100. The noise suppressing apparatus 100 functions as part of a device such as a digital camera, a notebook computer, or a mobile phone. However, the exemplary embodiment is not limited to this and is also applicable to an information processing apparatus of any type that requires noise removal from an input signal. FIG. 12 is a block diagram showing an example of the arrangement of an information processing apparatus 1200 according to the exemplary embodiment. The information processing apparatus 1200 includes a noise suppression unit 3 and a modification unit 7.

A noisy signal is input to an input terminal 1 as a sample value sequence. An FFT unit 2 performs transform such as Fourier transform of the noisy signal supplied to the input terminal 1, thereby dividing the signal into a plurality of frequency components. The noise suppression unit 3 receives the magnitude spectrum out of the plurality of frequency components, whereas an IFFT unit 4 is provided with the phase spectrum. Note that the magnitude spectrum is supplied to the noise suppression unit 3 in this case. However, the exemplary embodiment is not limited to this, and a power spectrum corresponding to the square of the magnitude spectrum may be supplied to the noise suppression unit 3.

A noise information memory 6 includes a memory element such as a semiconductor memory and stores noise information (information about noise characteristics). In particular, the noise information memory 6 stores noise spectrum forms as the noise information. However, the noise information memory 6 can also store, for example, the frequency characteristics of phases and features such as the intensities and time-rate changes for a specific frequency in place of or together with the spectra. The noise information can also include statistics (maxima, minima, variances, and medians) and the like. The noise information recorded in the noise information memory 6 is supplied to the modification unit 7. The modification unit 7 modifies the noise information into modified noise information by multiplying a scaling factor and supplies the modified noise information to the noise suppression unit 3.

The noise suppression unit 3 suppresses noise at each frequency using the noisy signal magnitude spectrum supplied by the FFT unit 2 and the modified noise information supplied by the modification unit 7, and provides the IFFT unit 4 with an enhanced signal magnitude spectrum as a noise suppression result. The modification unit 7 is also simultaneously provided with the enhanced signal magnitude spectrum. The modification unit 7 modifies the noise information based on the enhanced signal magnitude spectrum as the noise suppression result.

The IFFT unit 4 inversely transforms the combination of the enhanced signal magnitude spectrum supplied from the noise suppression unit 3 and the noisy signal phase supplied from the FFT unit 2, and supplies an enhanced signal sample to an output terminal 5.

<Arrangement of FFT Unit 2>

Figure 2:
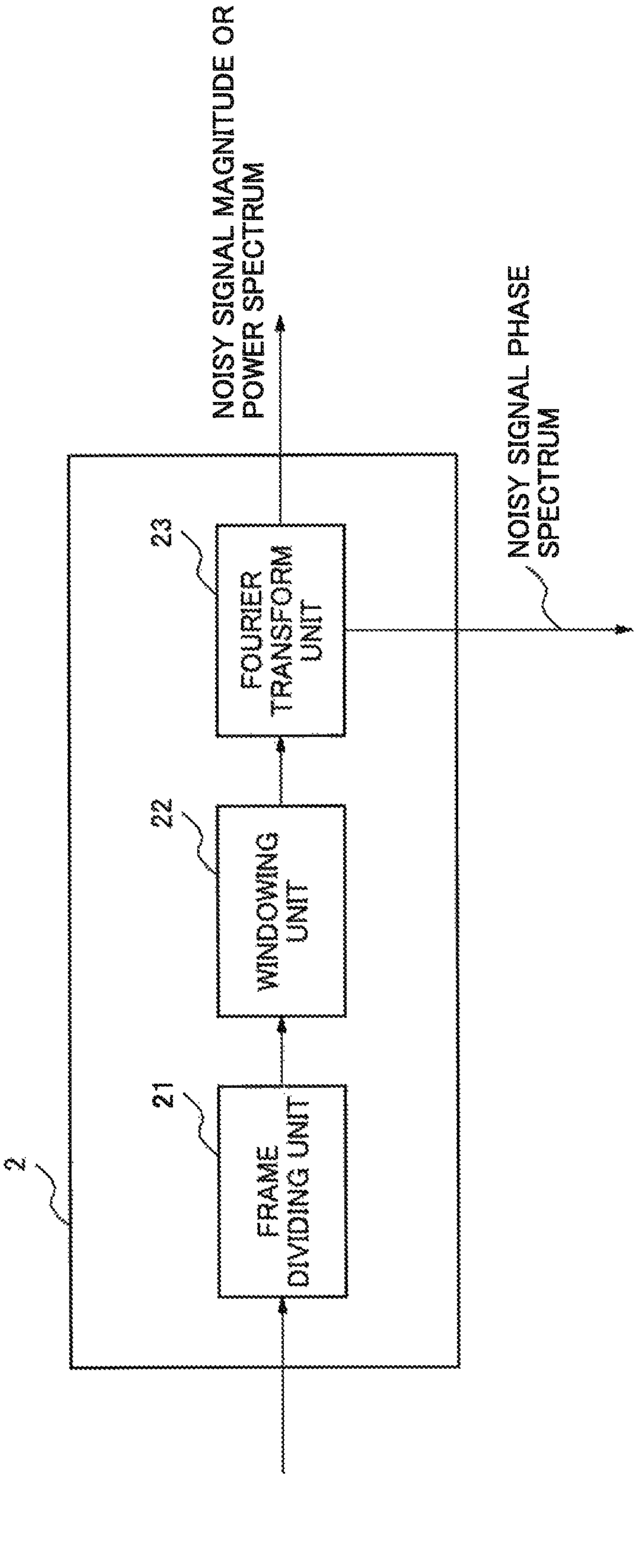
FIG. 2 is a block diagram showing the arrangement of an FFT (Fast Fourier Transform) unit 2 included in the noise suppressing apparatus 100 according to the first exemplary embodiment of the present invention.

FIG. 2 is a block diagram showing the arrangement of the FFT unit 2. As shown in FIG. 2, the FFT unit 2 includes a frame dividing unit 21, a windowing unit 22, and a Fourier transform unit 23. The frame dividing unit 21 receives the noisy signal sample and divides it into frames corresponding to K/2 samples, where K is an even number. The noisy signal sample divided into frames is supplied to the windowing unit 22 and multiplied by a window function w(t). The signal obtained by windowing an nth frame input signal yn(t) (t=0, 1, . . . , K/2−1) by w(t) is given by)

$$\bar{y}_n(t)=w(t)y_n(t) \tag{1}$$

Also widely conducted is windowing two successive frames partially overlaid (overlapping) each other. Assume that the overlap length is 50% the frame length. For t=0, 1, . . . , K/2−1, the windowing unit 22 outputs $\bar{y}_n(t)$ and $\bar{y}_n(t+K/2)$ given by $$\left.\begin{aligned}\bar{y}_n(t) &= w(t)y_{n-1}(t+K/2)\\ \bar{y}_n(t+K/2) &= w(t+K/2)y_n(t)\end{aligned}\right\} \tag{2}$$

A symmetric window function is used for a real signal. The window function makes the input signal match the output signal except an error when the spectral gain is set to 1 in the MMSE STSA method or zero is subtracted in the SS method. This means w(t)=w(t+K/2)=1.

The example of windowing two successive frames that overlap 50% will continuously be described below. The windowing unit 22 can use, for example, a hanning window w(t) given by $$w(t) = \begin{cases} 0.5 + 0.5\cos\left(\frac{\pi(t - K/2)}{K/2}\right), & 0 \le t < K \\ 0, & \text{otherwise} \end{cases} \quad (3)$$

Alternatively, the windowing unit 22 may use various window functions such as a hamming window, a Kaiser window, and a Blackman window. The windowed output is supplied to the Fourier transform unit 23 and transformed into a noisy signal spectrum Yn(k). The noisy signal spectrum Yn(k) is separated into the phase and the magnitude. A noisy signal phase spectrum argYn(k) is supplied to the IFFT unit 4, whereas a noisy signal magnitude spectrum |Yn(k)| is supplied to the noise suppression unit 3. As already described, the FFT unit 2 can use the power spectrum instead of the magnitude spectrum.

<Arrangement of IFFT Unit 4>

Figure 3:
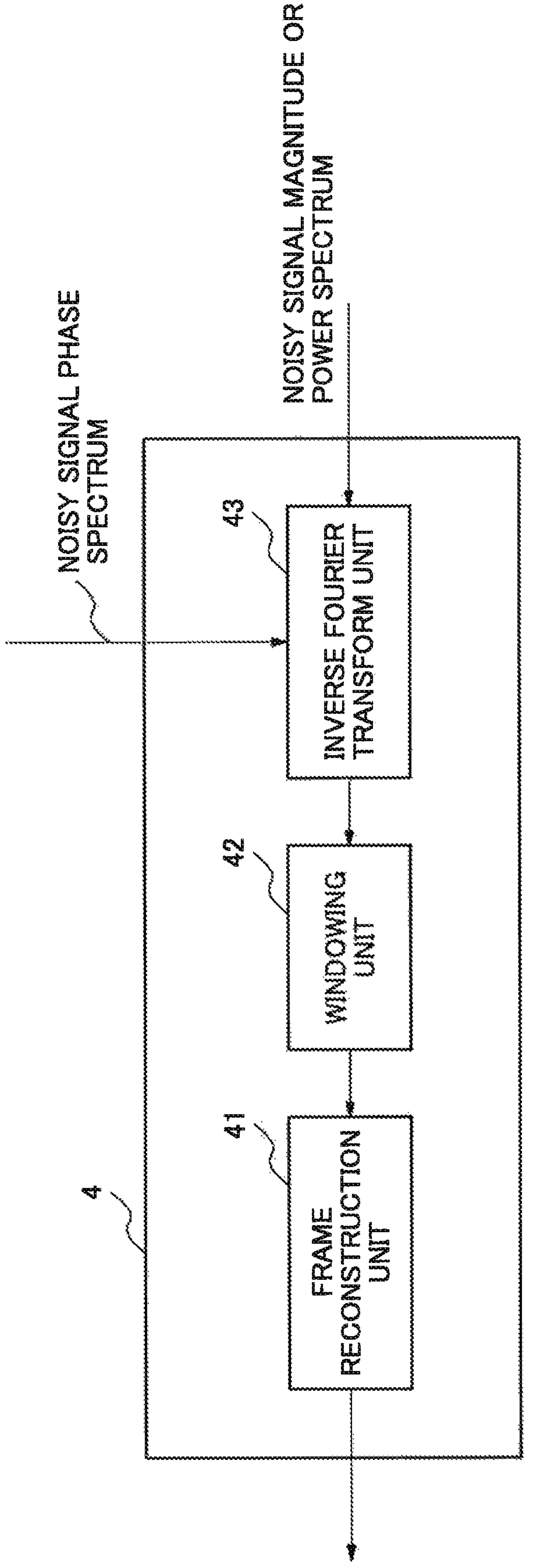
FIG. 3 is a block diagram showing the arrangement of an IFFT (Inverse Fast Fourier Transform) unit 4 included in the noise suppressing apparatus 100 according to the first exemplary embodiment of the present invention.

FIG. 3 is a block diagram showing the arrangement of the IFFT unit 4. As shown in FIG. 3, the IFFT unit 4 includes an inverse Fourier transform unit 43, a windowing unit 42, and a frame reconstruction unit 41. The inverse Fourier transform unit 43 combines the enhanced signal magnitude spectrum supplied from the noise suppression unit 3 with the noisy signal phase spectrum argYn(k) supplied from the FFT unit 2 to obtain an enhanced signal given by $$\overline{X}_n(k)=|\overline{X}_n(k)|\cdot\arg Y_n(k) \quad (4)$$

The inverse Fourier transform unit 43 inversely Fourier-transforms the resultant enhanced signal. The inversely Fourier-transformed enhanced signal is supplied to the windowing unit 42 as a series of time domain samples xn(t) (t=0, 1, . . . , K−1) in which one frame includes K samples and multiplied by the window function w(t). The signal obtained by windowing an nth frame input signal xn(t) (t=0, 1, . . . , K/2−1) by w(t) is given by $$\overline{x}_n(t)=w(t)x_n(t) \quad (5)$$

Also widely conducted is windowing two successive frames partially overlaid (overlapping) each other. Assume that the overlap length is 50% the frame length. For t=0, 1, . . . , K/2−1, the windowing unit 42 outputs) $\overline{x}_n(t)$ and $\overline{x}_n(t+K/2)$ given by $$\left.\begin{aligned} \overline{x}_n(t) &= w(t)x_{n-1}(t+K/2) \\ \overline{x}_n(t+K/2) &= w(t+K/2)x_n(t) \end{aligned}\right\} \quad (6)$$

and provides the frame reconstruction unit 41 with them.

The frame reconstruction unit 41 extracts the output of two adjacent frames from the windowing unit 42 for every K/2 samples, overlays them, and obtains an output signal $\hat{x}_n(t)$ given by $$\hat{x}_n(t)=\overline{x}_{n-1}(t+K/2)+\overline{x}_n(t) \quad (7)$$

for t=0, 1, . . . , K−1. The frame reconstruction unit 41 provides the output terminal 5 with the resultant output signal.

Note that the transform in the FFT unit 2 and the IFFT unit 4 in FIGS. 2 and 3 has been described above as Fourier transform. However, the FFT unit 2 and the IFFT unit 4 can use any other transform such as cosine transform, modified discrete cosine transform (MDCT), Hadamard transform, Haar transform, or Wavelet transform in place of the Fourier transform. For example, cosine transform or modified cosine transform obtains only a magnitude as a transform result. This obviates the necessity for the path from the FFT unit 2 to the IFFT unit 4 in FIG. 1. In addition, the noise information recorded in the noise information memory 6 needs to include only magnitudes (or powers), contributing to reduction of the memory size and the number of computations of a noise suppressing process. Haar transform allows to omit multiplication and reduce the area of an LSI chip. Since Wavelet transform can change the time resolution depending on the frequency, better noise suppression is expected.

Alternatively, after the FFT unit 2 has integrated a plurality of frequency components, the noise suppression unit 3 may perform actual suppression. In this case, the FFT unit 2 can achieve high sound quality by integrating more frequency components from the low frequency range where the discrimination capability of hearing characteristics is high to the high frequency range with a poorer capability. When noise suppression is executed after integrating a plurality of frequency components, the number of frequency components to which noise suppression is applied decreases. The noise suppressing apparatus 100 can thus decrease the whole number of computations.

<Processing of Noise Suppression Unit 3>

The noise suppression unit 3 can perform various kinds of suppression. Typical suppressing methods are the SS (Spectrum Subtraction) method and the MMSE STSA (Minimum Mean-Square Error Short-Time Spectral Amplitude Estimator) method. When using the SS method, the noise suppression unit 3 subtracts the modified noise information supplied by the modification unit 7 from the noisy signal magnitude spectrum supplied by the FFT unit 2. When using the MMSE STSA method, the noise suppression unit 3 calculates a spectral gain for each of the plurality of frequency components using the modified noise information supplied by the modification unit 7 and the noisy signal magnitude spectrum supplied by the FFT unit 2. The noise suppression unit 3 then multiplies the noisy signal magnitude spectrum by the spectral gain. The spectral gain is determined so as to minimize the mean square power of the enhanced signal.

The noise suppression unit 3 can apply flooring to avoid excessive noise suppression. Flooring is a method of avoiding suppression beyond the maximum suppression amount. A flooring parameter determines the maximum suppression amount. When using the SS method, the noise suppression unit 3 imposes restrictions so the result obtained by subtracting the modified noise information from the noisy signal magnitude spectrum is not smaller than the flooring parameter. More specifically, if the subtraction result is smaller than the flooring parameter, the noise suppression unit 3 replaces the subtraction result with the flooring parameter. In case of using the MMSE STSA method, if the spectral gain obtained from the modified noise information and the noisy signal magnitude spectrum is smaller than the flooring parameter, the noise suppression unit 3 replaces the spectral gain with the flooring parameter. Details of the flooring are disclosed in literature "M. Berouti, R. Schwartz, and J. Makhoul", "Enhancement of speech corrupted by acoustic noise", Proceedings of ICASSP'79, pp. 208-211, April 1979". When the flooring is introduced, the noise suppression unit 3 does not perform excessive suppression. The flooring can prevent the enhanced signal from having a larger distortion.

The noise suppression unit 3 can also set the number of frequency components of the noise information to be smaller than the number of frequency components of the noisy signal spectrum. At this time, a plurality of frequency components share a plurality of pieces of noise information. The frequency resolution of the noisy signal spectrum is higher than in a case in which the plurality of frequency components are integrated for both the noisy signal spectrum and the noise information. For this reason, the noise suppression unit 3 can achieve high sound quality by calculation in an amount smaller than in case of the absence of frequency component integration. Japanese Patent Laid-Open No. 2008-203879 discloses details of suppression using noise information whose number of frequency components is smaller than the number of frequency components of the noisy signal spectrum.

<Arrangement of Modification Unit 7>

Figure 4:
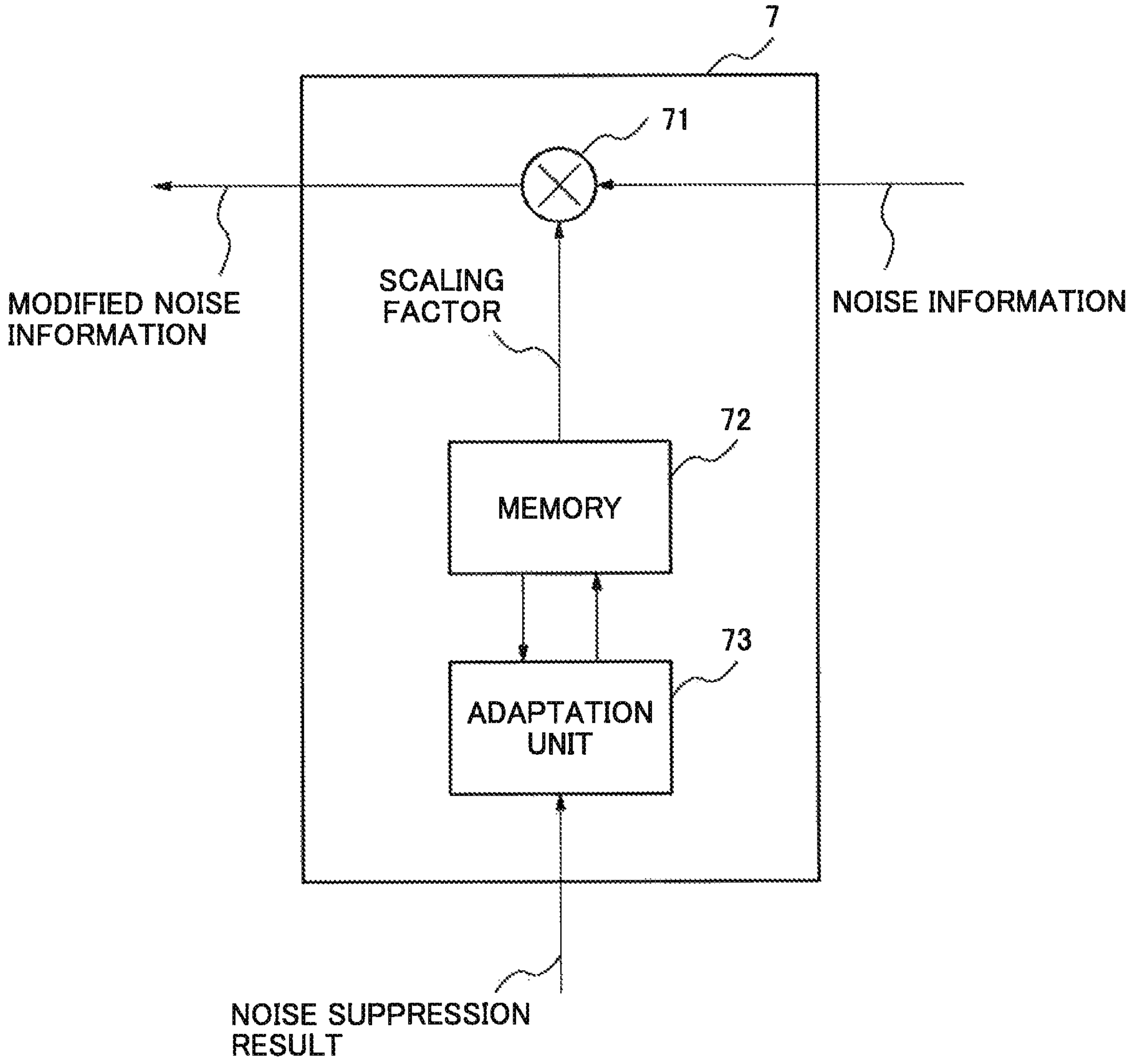
FIG. 4 is a block diagram showing the arrangement of a modification unit included in the noise suppressing apparatus 100 according to the first exemplary embodiment of the present invention.

FIG. 4 is a block diagram showing the arrangement of the modification unit 7. As shown in FIG. 4, the modification unit 7 includes a multiplier 71, a memory 72, and an adaptation unit 73. The noise information supplied to the modification unit 7 is supplied to the multiplier 71. The memory 72 stores a scaling factor serving as modification information to be used to modify the noise information. The multiplier 71 obtains the product of the noise information and a scaling factor and outputs the product as modified noise information.

On the other hand, the noise suppression unit 3 supplies the enhanced signal magnitude spectrum as the noise suppression result to the adaptation unit 73. The adaptation unit 73 reads out the scaling factor from the memory 72, changes the scaling factor using the noise suppression result, and supplies the new scaling factor after the change to the memory 72. The memory 72 newly stores the new scaling factor in place of the old scaling factor stored so far.

When adapting the scaling factor using the noise suppression result fed back to the modification unit 7, the adaptation unit 73 adapts the scaling factor such that the larger the noise suppression result at a timing without target signal input is (the larger the noise remaining without being suppressed is), the larger the modified noise information is. The large noise suppression result at the timing without target signal input indicates insufficient suppression. For this reason, the modified noise information is preferably made larger by changing the scaling factor. When the modified noise information is large, the subtraction value of the SS method is large, and the noise suppression result thus becomes small. In multiplication-based suppression such as the MMSE STSA method, the signal-to-noise ratio (SNR) estimate to be used to calculate the spectral gain is small, and therefore, a small spectral gain can be obtained. This leads to more intensive suppression. A plurality of methods are available to adapt the scaling factor. A re-calculation algorithm and a recursive adaptation algorithm will be described as examples.

In an ideal noise suppression result, noise is completely suppressed. The modification unit 7 can recalculate or recursively adapt the scaling factor, for example, when the magnitude or power of the noisy signal is small so as to completely suppress noise. This is because the power of the signal other than the noise to be suppressed is small at high probability when the magnitude or power of the noisy signal is small. The modification unit 7 can detect the small magnitude or power of the noisy signal using the fact that the magnitude or power of the noisy signal is smaller than a threshold.

The modification unit 7 can also detect the small magnitude or power of the noisy signal using the fact that the difference between the magnitude or power of the noisy signal and the noise information recorded in the noise information memory 6 is smaller than a threshold. That is, the modification unit 7 uses the fact that when the magnitude or power of the noisy signal is similar to the noise information, the noise information makes up a large part of the noisy signal (the SNR is low). Especially, the modification unit 7 can compare the spectral envelopes using a combination of information at a plurality of frequency points, thereby raising the detection accuracy.

The scaling factor in the SS method is recalculated such that the modified noise information equals the noisy signal spectrum for each frequency at the timing without target signal input. In other words, the adaptation unit 73 obtains a scaling factor αn(k) so as to make the noisy signal magnitude spectrum |Yn(k)| supplied from the FFT unit 2 when only noise has been input match the product of the scaling factor αn and noise information v(k). That is, the scaling factor αn(k) is calculated by $$\alpha n(k)=|Yn(k)|/vn(k) \tag{8}$$

where n is the frame number, and k is the frequency number.

On the other hand, recursive adaptation of the scaling factor in the SS method is done by gradually adapting the scaling factor such that the enhanced signal magnitude spectrum at the timing without target signal input approaches zero for each frequency. When using the LMS (Least Squares Method) algorithm for recursive adaptation, the modification unit 7 calculates αn+1(k) using an error en(k) of the nth frame for the frequency number k as $$\alpha n+1(k)=\alpha n(k)+\mu en(k)/vn(k) \tag{9}$$

where μ is a microconstant called a step size. If the scaling factor αn(k) obtained by the calculation is to be used immediately, the modification unit 7 uses $$\alpha n(k)=\alpha n-1(k)+\mu en(k)/vn(k) \tag{10}$$

in place of equation (9). That is, the modification unit 7 calculates the current scaling factor αn(k) using the current error and immediately applies it. The modification unit 7 can implement accurate noise suppression in real time by immediately adapting the scaling factor.

When using the NLMS (Normalized Least Squares Method) algorithm, the modification unit 7 calculates the scaling factor αn+1(k) using the above-described error en(k) as $$\alpha n+1(k)=\alpha n(k)+\mu en(k)vn(k)/\sigma n(k)^2 \tag{11}$$

where $\sigma n(k)^2$ is the average power of the noise information vn(k), which can be calculated using an average (a moving average using a slide window) based on an FIR filter or an average (leaky integration) based on an IIR filter.

The modification unit 7 may calculate the scaling factor αn+1(k) using a perturbation method as $$\alpha n+1(k)=\alpha n(k)+\mu en(k) \tag{12}$$

Alternatively, the modification unit 7 may calculate the scaling factor αn+1(k) using a signum function sgn{en(k)} representing only the sign of the error as $$\alpha n+1(k)=\alpha n(k)+\mu\cdot\mathrm{sgn}\{en(k)\} \tag{13}$$

Similarly, the modification unit 7 may use the LS (Least Squares) algorithm or any other adaptive algorithm. The modification unit 7 can also immediately apply the adapted scaling factor. In this case, the implementor of the noise suppressing apparatus 100 may design the modification unit 7 to adapt the scaling factor in real time by modifying equations (11) to (13) with reference to the change from equation (9) to equation (10).

The MMSE STSA method recursively adapts the scaling factor. The modification unit 7 adapts the scaling factor αn(k) for each frequency by the same methods as those described using equations (8) to (13).

As the characteristic features of the above-described re-calculation and recursive adaptation algorithms serving as the scaling factor adaptation method, the re-calculation algorithm has a high follow-up speed, and the recursive adaptation algorithm has a high accuracy. To make use these characteristic features, the modification unit 7 may change the adaptation method so as to, for example, first use the re-calculation algorithm and then use the recursive adaptation algorithm. When determining the timing to change the adaptation method, the modification unit 7 may change the adaptation method on condition that the scaling factor has sufficiently approached the optimum value. Alternatively, the modification unit 7 may change the adaptation method when, for example, a predetermined time has elapsed. Otherwise, the modification unit 7 may change the adaptation method when the modification amount of the scaling factor has fallen below a predetermined threshold.

As described above, when modifying noise information to be used in noise suppression, the noise suppressing apparatus 100 of the exemplary embodiment adapts, based on the noise suppression result, modification information to be used for the modification. It is therefore possible to suppress various kinds of noise including unknown noise without storing a number of pieces of noise information in advance.

(Second Exemplary Embodiment)

The second exemplary embodiment will be described with reference to FIG. 5. In the first exemplary embodiment, the scaling factor is used as the modification information to be used to modify the noise signal. However, the exemplary embodiment is not limited to this. A value obtained by adding an offset to the scaling factor may be used as the modification information. In this case, both the scaling factor and the offset are adapted based on the noise suppression result.

Figure 5:
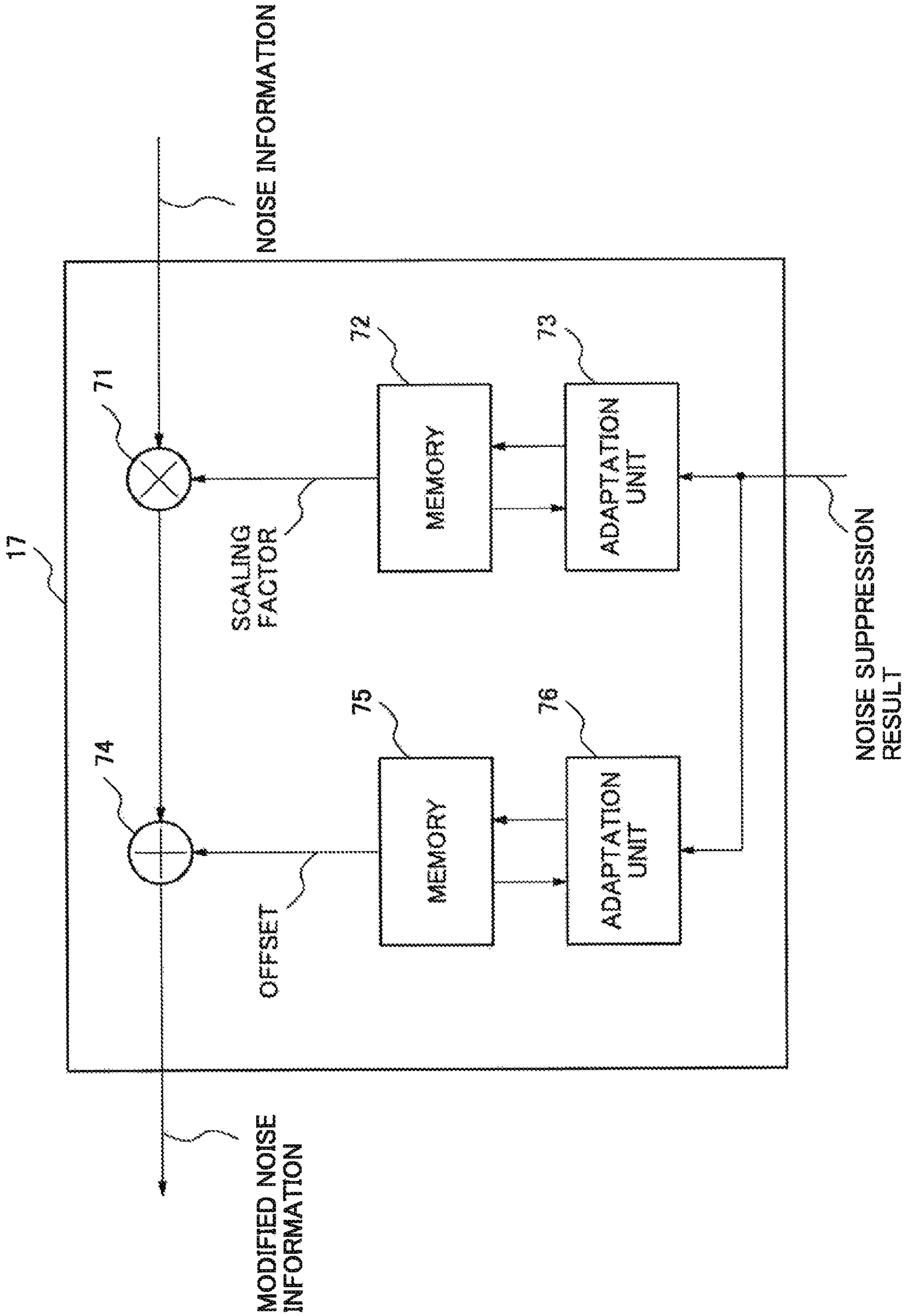
FIG. 5 is a block diagram showing another arrangement of a modification unit included in a noise suppressing apparatus 100 according to the second exemplary embodiment of the present invention.

FIG. 5 is a block diagram showing the arrangement of a modification unit 17 according to the exemplary embodiment. As shown in FIG. 5, the modification unit 17 includes an adder 74, a memory 75, and an adaptation unit 76 in addition to the arrangement described with reference to FIG. 4. The operations of a multiplier 71, a memory 72, and an adaptation unit 73 are the same as those described using FIG. 4, and a description thereof will not be repeated.

The multiplier 71 multiplies input noise information by the scaling factor read out from the memory 72 and supplies the product to the adder 74. The adder 74 subtracts an offset value stored in the memory 75 from the output of the multiplier 71 and outputs the difference as modified noise information.

On the other hand, the adaptation unit 76 receives, from a noise suppression unit 3, the same noise suppression result as that for the adaptation unit 73, adapts the offset value stored in the memory 75 using the noise suppression result, and supplies the new offset value to the memory 75. The memory 75 newly stores the new offset value in place of the old offset value stored so far.

As described above, a noise suppressing apparatus 100 of the exemplary embodiment uses the scaling factor and the offset as the modification information to be used to modify noise information. This allows to more finely modify the noise information and consequently improve the noise suppression effect.

Note that in the first and second exemplary embodiments, the scaling factor and the offset have been exemplified as the modification information. However, the exemplary embodiments are not limited to this, and any other information (for example, a polynomial or nonlinear function of noise information) may be used.

(Third Exemplary Embodiment)

Figure 6:
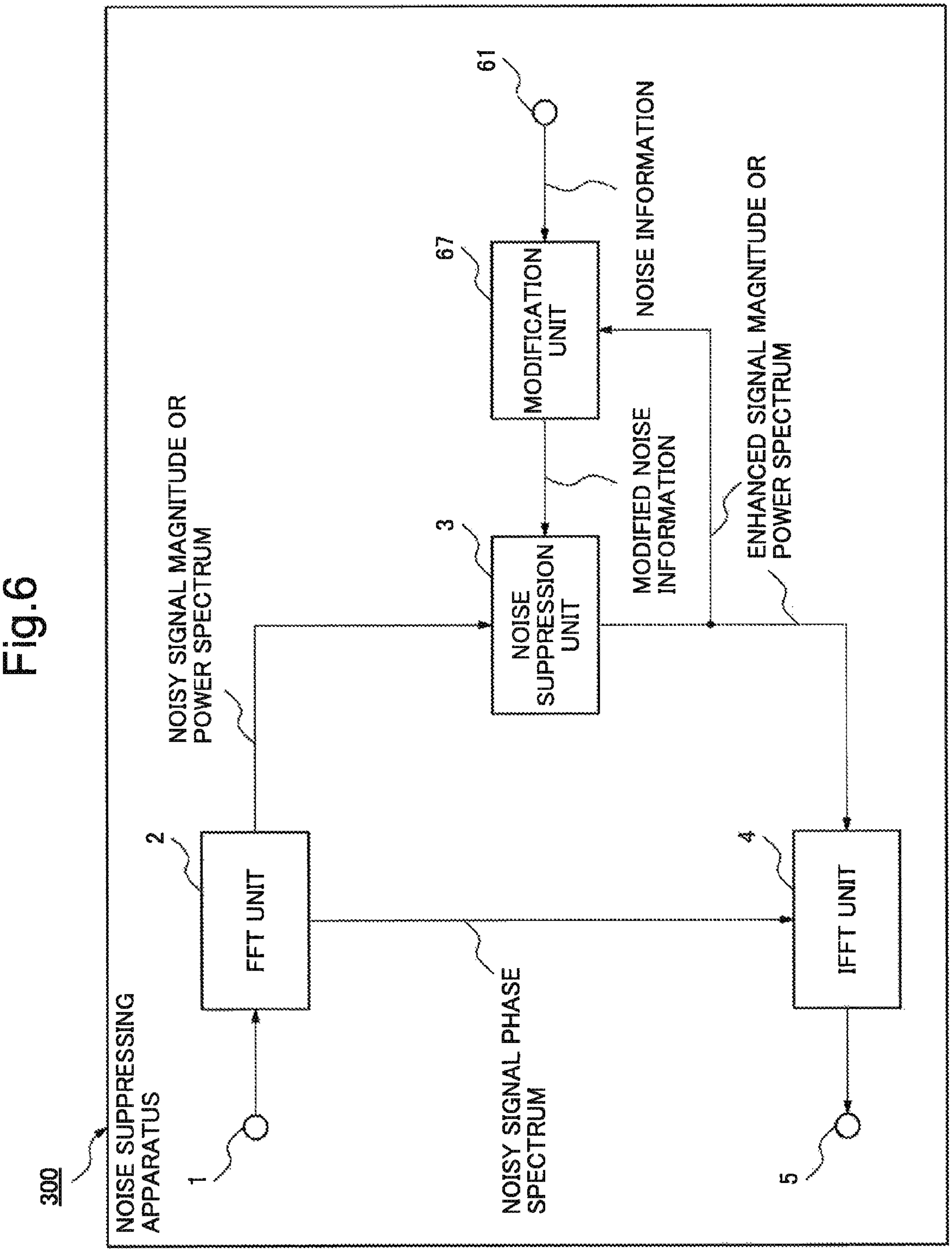
FIG. 6 is a block diagram showing the schematic arrangement of a noise suppressing apparatus 300 according to the third exemplary embodiment of the present invention.

The third exemplary embodiment will be described with reference to FIG. 6. A noise suppressing apparatus 300 according to the third exemplary embodiment includes no noise information memory 6, unlike the above-described first exemplary embodiment. Hence, a modification unit 67 is provided with a real-time noise spectrum input from an input terminal 61. The remaining arrangements and operations are the same as in the first exemplary embodiment, and a detailed description thereof will not be repeated.

For example, assume a case in which another microphone exists near the noise source, and the input terminal 61 is provide with the output from the noise microphone. However, the exemplary embodiment is not limited to this and is also applicable to any other case if the noise information can be obtained externally. In this case as well, the modification unit 67 generates modified noise information by modifying the noise information based on the noise suppression result, and provides a noise suppression unit 3 with the modified noise information, as in the first exemplary embodiment.

The noise suppressing apparatus 300 of the exemplary embodiment can obtain more accurate noise information and also follow variations in noise. It is therefore possible to more effectively suppress various kinds of noise including unknown noise without storing a number of pieces of noise information in advance. In particular, the presence of the modification unit 67 enables to follow variations in the electrical characteristics of the target signal microphone and the noise microphone.

(Fourth Exemplary Embodiment)

Figure 7:
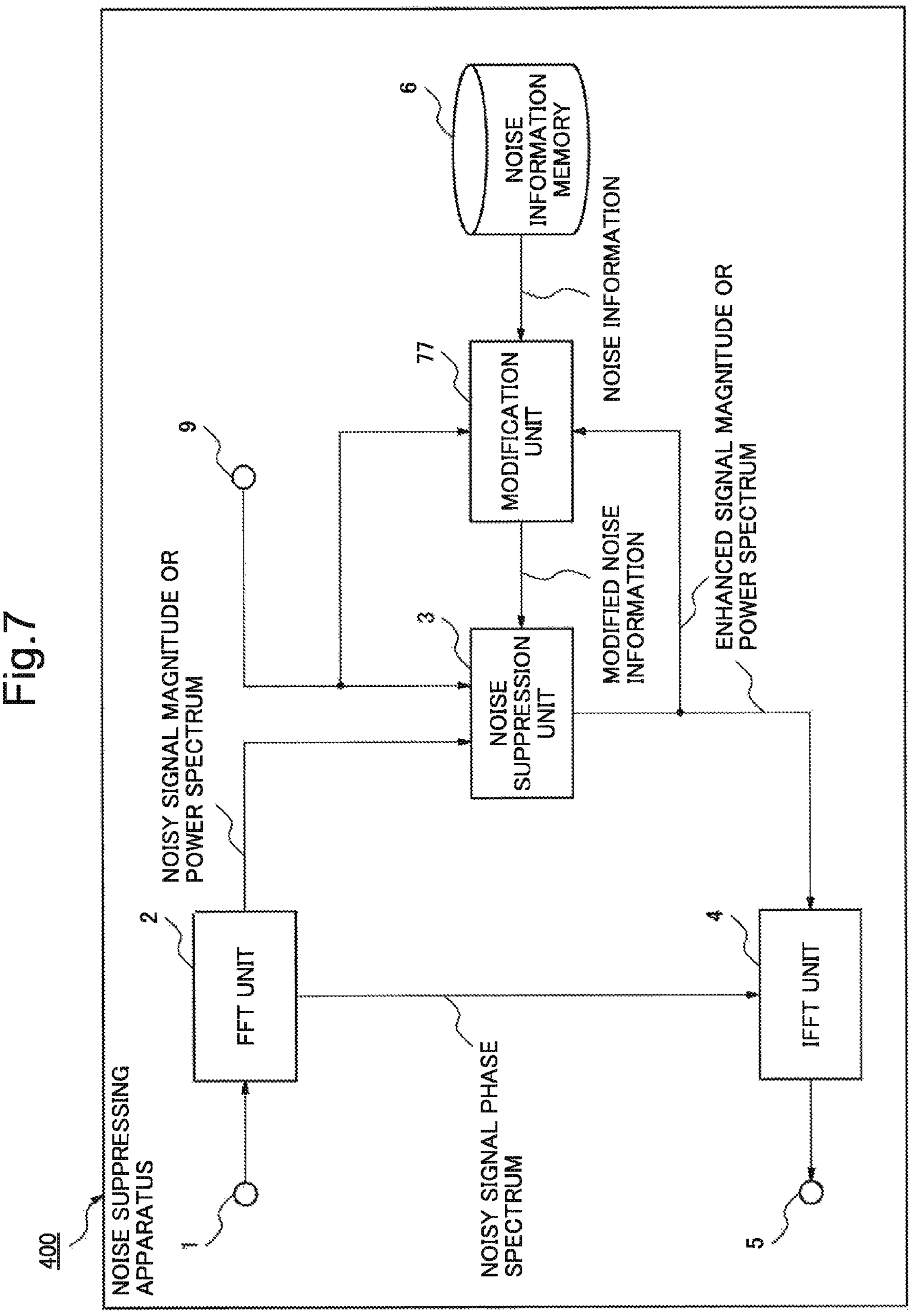
FIG. 7 is a block diagram showing the schematic arrangement of a noise suppressing apparatus 400 according to the fourth exemplary embodiment of the present invention.

The fourth exemplary embodiment will be described with reference to FIG. 7. A noise suppression unit 3 and a modification unit 77 included in a noise suppressing apparatus 400 according to the fourth exemplary embodiment additionally receive, from an input terminal 9, information (noise existence information) representing whether specific noise exists in the input noisy signal. This makes it possible to reliably suppress noise at a timing specific noise exists and simultaneously adapt the modification information. The remaining arrangements and operations are the same as in the first exemplary embodiment, and a detailed description thereof will not be repeated.

The noise suppressing apparatus 400 of the exemplary embodiment does not adapt the modification information at a timing specific noise does not exist. Hence, a higher noise suppression accuracy can be obtained for the specific noise.

(Fifth Exemplary Embodiment)

Figure 8:
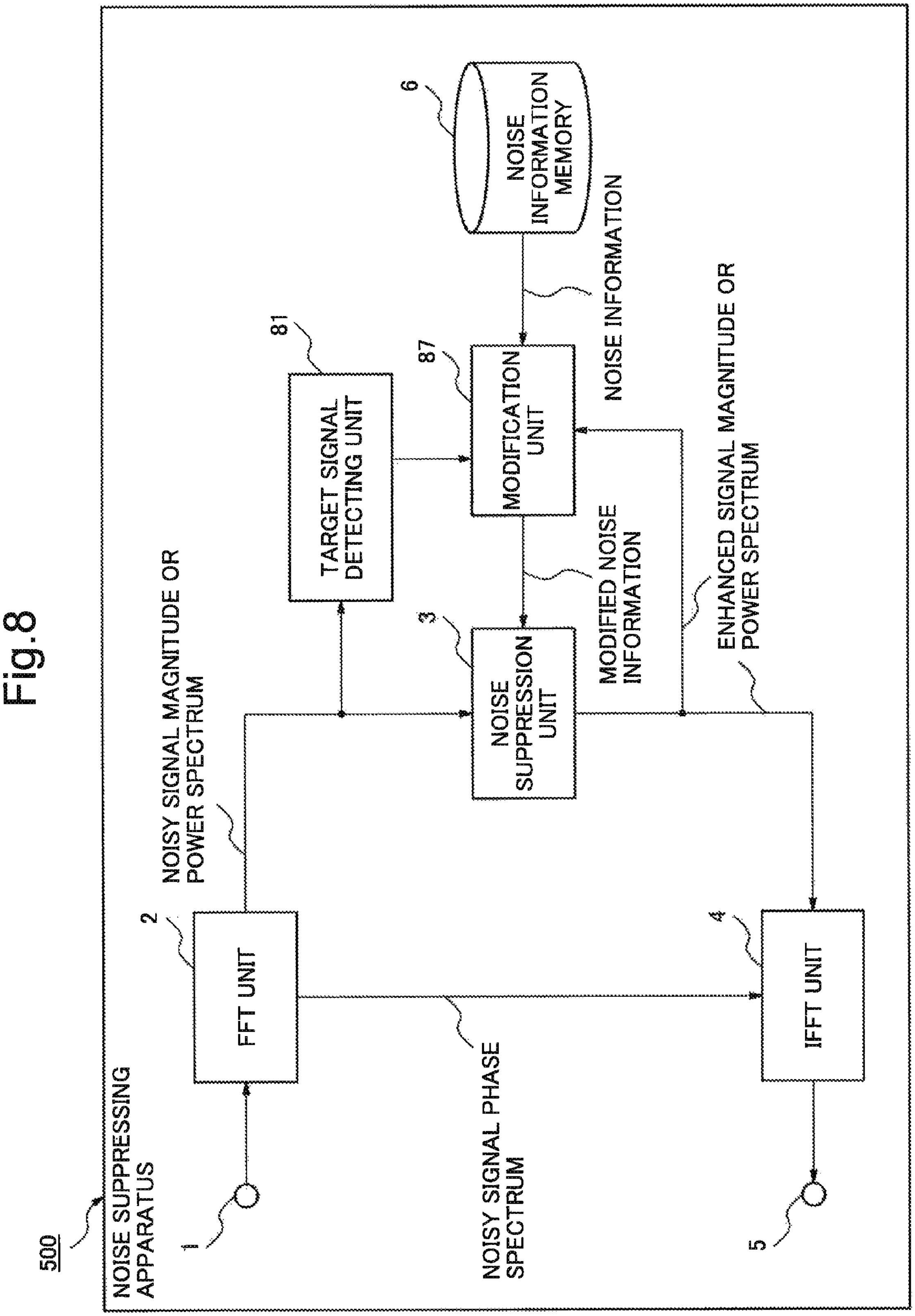
FIG. 8 is a block diagram showing the schematic arrangement of a noise suppressing apparatus 500 according to the fifth exemplary embodiment of the present invention.

The fifth exemplary embodiment will be described with reference to FIG. 8. A noise suppressing apparatus 500 of the exemplary embodiment includes a target signal detecting unit 81. An FFT unit 2 provides the target signal detecting unit 81 with a noisy signal magnitude spectrum. The target signal detecting unit 81 analyzes the noisy signal magnitude spectrum and determines whether the target signal exists or the degree of existence.

Based on the determination result from the target signal detecting unit 81, a modification unit 87 adapts modification information to be used to modify noise information. For example, without the target signal, the noisy signal includes only noise, and the suppression result of a noise suppression unit 3 has to be zero. Hence, the modification unit 87 adjusts the scaling factor and the like so as to obtain zero as the noise suppression result at this time.

On the other hand, when the noisy signal includes the target signal, the modification unit 87 adapts the modification information in accordance with the existence ratio of the target signal. For example, if the ratio of the target signal existing in the noisy signal is 10%, the modification unit 87 adapts the modification information partially (only 90%).

The noise suppressing apparatus 500 of the exemplary embodiment adapts the modification information in accordance with the ratio of noise in the noisy signal. This allows to obtain a more accurate noise suppression result.

(Sixth Exemplary Embodiment)

Figure 9:
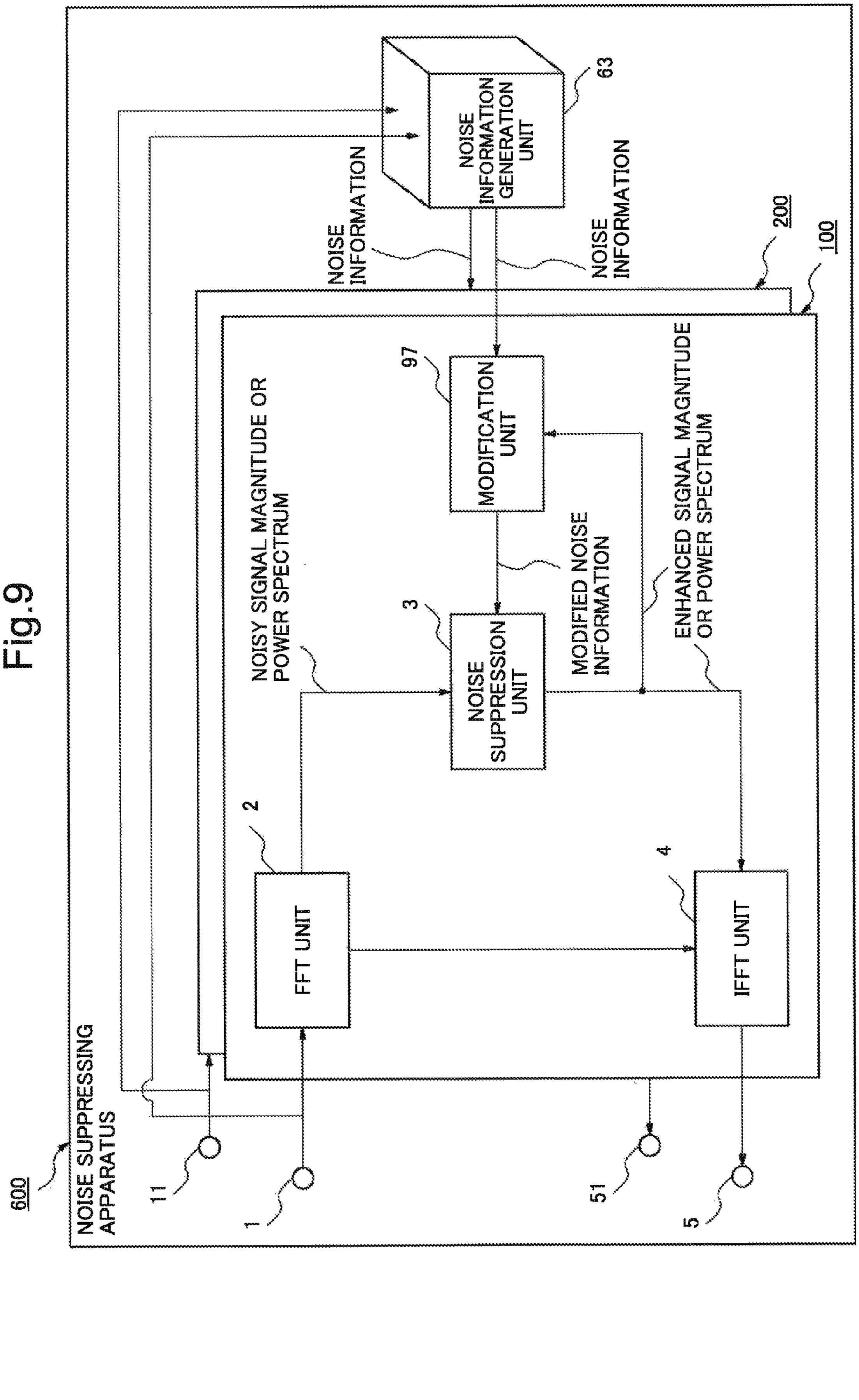
FIG. 9 is a block diagram showing the schematic arrangement of a noise suppressing apparatus 600 according to the sixth exemplary embodiment of the present invention.

The sixth exemplary embodiment will be described with reference to FIG. 9. A noise suppressing apparatus 600 according to the exemplary embodiment includes no noise information memory 6 but a noise information generation unit 63 instead. The noise information generation unit 63 generates noise information using signals input from a plurality of input terminals 1 and 11 and provides a modification unit 97 with the noise information. With, for example, a plurality of microphones, the noise suppressing apparatus 600 can form directivity. Especially for an acoustic signal, the noise suppressing apparatus 600 can form a sharp direction of a low sensitivity (null). The noise suppressing apparatus 600 makes the direction of a low sensitivity match the direction of arrival (DOA) of the target signal to suppress only the target signal, thereby extracting only noise as the output. Details of directivity formation using a plurality of microphones are disclosed in, for example, literature "M. Brandstein and D. Ward, Eds"., "Microphone Arrays", O. Hoshuyama and A. Sugiyama, Chap. 5, "Robust Adaptive Beamforming", Springer, Berlin, pp. 87-109, January 2001. According to this method, even when it is difficult to arrange a microphone near the noise source, noise information can be obtained in real time, in addition to the effect of the third exemplary embodiment.

(Seventh Exemplary Embodiment)

Figure 10:
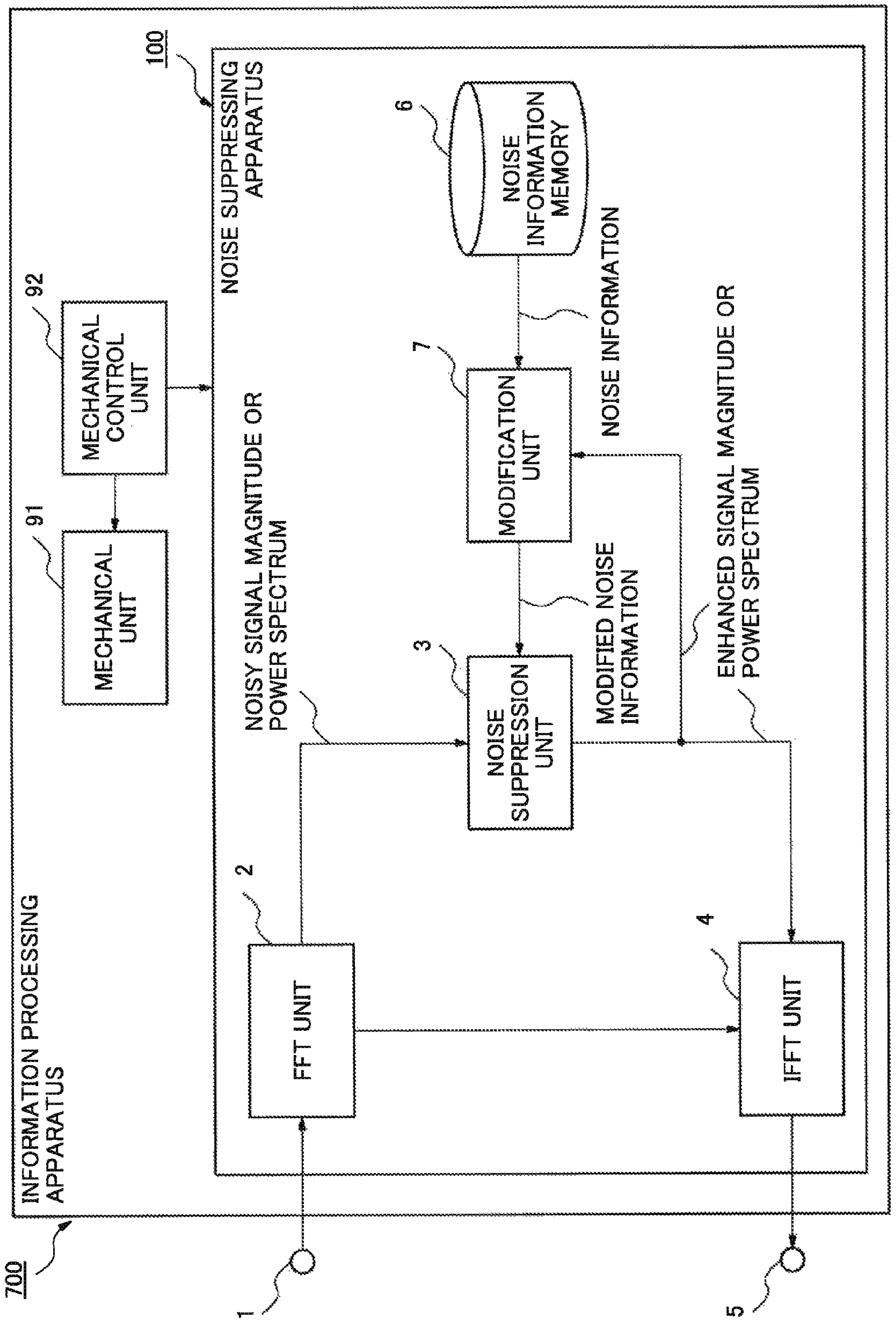
FIG. 10 is a block diagram showing the schematic arrangement of an information processing apparatus 700 including a noise suppressing apparatus 100 according to the seventh exemplary embodiment of the present invention.

The seventh exemplary embodiment will be described with reference to FIG. 10. FIG. 10 is a block diagram showing an information processing apparatus 700 including a noise suppressing apparatus 100 described in the first exemplary embodiment. The information processing apparatus 700 includes a mechanical unit 91 serving as a noise source, and a mechanical control unit 92 that controls the mechanical unit 91. When the mechanical control unit 92 operates the mechanical unit 91 for some reason, the noise suppressing apparatus 100 is provided with the operation information. This allows the noise suppressing apparatus 100 to reliably operate to adapt modification information during the operation of the mechanical unit 91. Alternatively, the mechanical control unit 92 may operate the mechanical unit 91 based on an instruction from the noise suppressing apparatus 100 to generate noise, and simultaneously, a modification unit 7 in the noise suppressing apparatus 100 may adapt modification information using a noisy signal including the noise.

(Other Exemplary Embodiments)

The first to seventh exemplary embodiments have been described above concerning noise suppressing apparatuses having different characteristic features. Exemplary embodiments also incorporate noise suppressing apparatuses formed by combining the characteristic features in whatever way.

The present invention may be applied to a system including a plurality of devices or a single apparatus. The present invention is also applicable when the signal processing program of software for implementing the functions of the exemplary embodiments to the system or apparatus directly or from a remote site. Hence, the present invention also incorporates a program that is installed in a computer to cause the computer to implement the functions of the present invention, a medium that stores the program, and a WWW server from which the program is downloaded.

Figure 11:
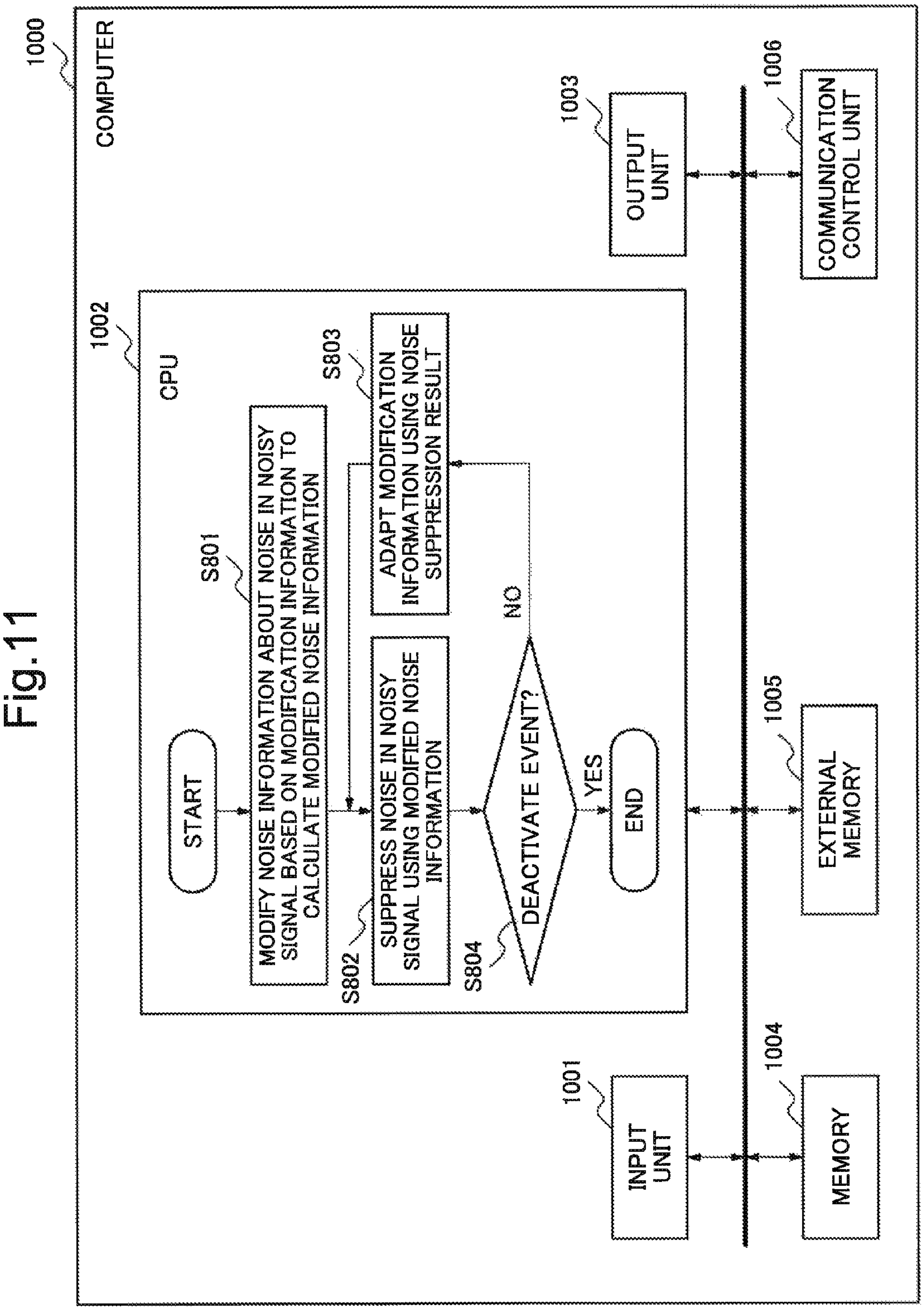
FIG. 11 is a schematic block diagram of a computer 1000 that executes a signal processing program according to still another exemplary embodiment of the present invention.

FIG. 11 is a block diagram of a computer 1000 that executes a signal processing program configured as the first to seventh exemplary embodiments. The computer 1000 includes an input unit 1001, a CPU 1002, an output unit 1003, a memory 1004, an external memory 1005, and a communication control unit 1006.

The CPU 1002 controls the operation of the computer 1000 by reading out the signal processing program. More specifically, upon executing the signal processing program, the CPU 1002 modifies, based on modification information, a noise signal associated with noise in the noisy signal, thereby calculating modified noise information (S801). Next, the CPU 1002 suppresses the noise in the noisy signal using the modified noise information (S802). The CPU 1002 determines whether a deactivate event has been input (S804). If no deactivate event has been input, the CPU 1002 adapts the modification information using the noise suppression result (S803). If a deactivate event has been input, the CPU 1002 ends the signal processing. That is, the CPU 1002 repeatedly executes noise information generation/adaptation and noise suppression until the deactivate event is input. Various deactivate events are assumed, including power-off and microphone-off.

This makes it possible to obtain the same effects as in the first to seventh exemplary embodiments.

While the present invention has been described above with reference to exemplary embodiments, the invention is not limited to the exemplary embodiments. The arrangement and details of the present invention can variously be modified without departing from the spirit and scope thereof, as will be understood by those skilled in the art.

The invention claimed is:

1. A signal processing method for suppressing noise in a noisy signal comprising:

reading out basic noise information stored in a noise storage unit in advance as information related to noise which may exist in the noisy signal;

modifying the basic noise information read out from the noise storage unit using noise modification information stored in a noise modification information storage unit in advance to obtain modified noise information;

suppressing the noise in the noisy signal using the modified noise information; and updating the noise modification information stored in the noise modification information storage unit based on the result of said step of suppressing.

2. The signal processing method according to claim 1, wherein the noise modification information includes a scaling factor, and the modified noise information is obtained by multiplying the basic noise information by the scaling factor.

3. The signal processing method according to claim 2, wherein the noise modification information includes an offset, and the modified noise information is obtained by subtracting the offset from the basic noise information.

4. The signal processing method according to claim 1, further comprising inputting the basic noise information from a noise source and using the basic noise information to suppress the noise in the noisy signal.

5. The signal processing method according to claim 1, further comprising inputting information representing whether noise exists in the noisy signal, and updating the noise modification information when the noise exists in the noisy signal.

6. The signal processing method according to claim 1, further comprising determining a degree of existence of a target signal in the noisy signal by analyzing the noisy signal, and updating the noise modification information based on the determination result.

7. The signal processing method according to claim 1, further comprising generating the basic noise information using a plurality of noisy signals input from a plurality of input terminals and using the basic noise information to suppress the noise in the noisy signal.

8. An information processing apparatus comprising:

a noise suppressor that suppresses noise in a noisy signal;

a noise storage unit that stores basic noise information in advance as information related to noise which may exist in the noisy signal;

a noise modification information storage unit that stores noise modification information to modify the basic noise information read out from the noise storage unit;

a modification unit that modifies the basic noise information using noise modification information stored in noise modification information storage unit to obtain modified noise information and an updating unit that updates the noise modification information stored in the noise modification information storage unit, wherein said noise suppressor suppresses the noise in the noisy signal using the modified noise information, and said updating unit updates the noise modification information based on the noise suppression result.

9. The information processing apparatus according to claim 8, further comprising:

a mechanical unit serving as a noise source; and a mechanical control unit that controls said mechanical unit, wherein the noise modification information is updated using noise generated by operating said mechanical unit via said mechanical control unit.

10. A computer readable non-transitory medium for storing a signal processing program that causes a computer to execute:

a reading process of reading out basic noise information stored in a noise storage unit in advance as information related to noise which may exist in a noisy signal;

a modified noise information generation process of obtaining modified noise information by modifying the basic noise information read out from the noise storage unit using noise modification information stored in a noise modification information storage unit in advance;

a noise suppressing process of suppressing noise in the noisy signal using the modified noise information; and an updating process of updating the noise modification information stored in the noise modification information storage unit based on the result of the noise suppressing process.

11. An information processing apparatus comprising:

noise suppression means for suppressing noise in a noisy signal;

noise storage means for storing basic noise information in advance as information related to noise which may exist in the noisy signal;

noise modification information storage means for storing noise modification information to modify the basic noise information read out from the noise storage unit;

modification means for modifying the basic noise information, using noise modification information stored in noise modification information storage means to obtain modified noise information; and an updating means for updating the noise modification information stored in the noise modification information storage means, wherein said noise suppression means suppresses the noise in the noisy signal using the modified noise information, and the updating means updates the noise modification information based on the noise suppressing result.

* * * * *